(12) United States Patent
Street

(10) Patent No.: US 7,754,542 B2
(45) Date of Patent: Jul. 13, 2010

(54) PRINTED TFT ARRAY

(75) Inventor: Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 28 days.

(21) Appl. No.: 11/960,160

(22) Filed: Dec. 19, 2007

(65) Prior Publication Data

US 2009/0159886 A1 Jun. 25, 2009

(51) Int. Cl.
*H01L 21/00* (2006.01)

(52) U.S. Cl. ............... 438/149; 438/610; 257/E27.116; 257/E33.062; 257/E21.535; 257/E21.533

(58) Field of Classification Search ............... 427/466; 438/610, 67, 149; 257/E21.497, E21.586, 257/E21.7, E21.533, E21.535, E29.062, E27.116
See application file for complete search history.

(56) References Cited

U.S. PATENT DOCUMENTS

| | | | |
|---|---|---|---|
| 6,011,531 A | 1/2000 | Mei et al. | |
| 6,521,489 B2 | 2/2003 | Duthaler et al. | |
| 7,098,061 B2 * | 8/2006 | Sirringhaus et al. | ............ 438/30 |
| 7,198,885 B2 * | 4/2007 | Kawase | ...................... 430/313 |
| 7,256,842 B2 * | 8/2007 | Hwang et al. | .................. 349/38 |
| 7,270,694 B2 | 9/2007 | Li et al. | |
| 7,407,849 B2 * | 8/2008 | Sirringhaus et al. | ......... 438/197 |
| 2004/0144975 A1 * | 7/2004 | Seki et al. | ...................... 257/40 |
| 2006/0172219 A1 | 8/2006 | Stasiak et al. | |
| 2007/0148464 A1 * | 6/2007 | Nishimura et al. | .......... 428/409 |
| 2008/0248609 A1 * | 10/2008 | Yamazaki et al. | ............. 438/99 |
| 2009/0025215 A1 * | 1/2009 | Murakami et al. | ............ 29/846 |

OTHER PUBLICATIONS

Street, Robert A. et al., "Jet Printing Flexible Displays", *Materials Today*, vol. 9, Issue 4, Apr. 2006, pp. 32-37.
Arias, Ana C. et al., "All-Additive Ink-Jet-Printed Display Backplanes: Materials, Development and Integration", *Journal of SID*, 15/7, Jul. 15, 2007, pp. 485-489.

* cited by examiner

*Primary Examiner*—Caridad M Everhart
(74) *Attorney, Agent, or Firm*—Fay Sharpe LLP

(57) ABSTRACT

An electronic device and/or component is manufactured using additive processing steps, including additive printing steps. A first layer is printed using additive printing techniques wherein a single first material is used to print the first layer in a single processing step. A second layer is printed in more than a single printing step where a first portion of the second layer is printed using a second material and a second portion of the second layer is printed using a third material, and the second and third materials are different from each other.

13 Claims, 9 Drawing Sheets

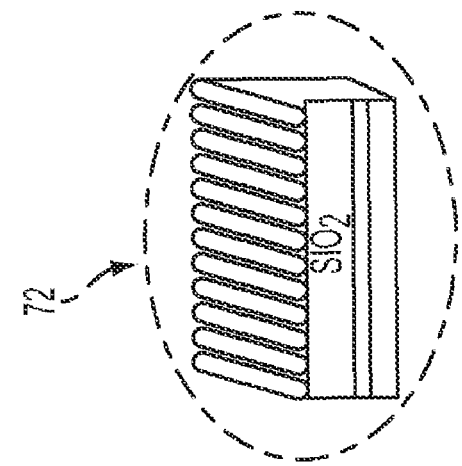
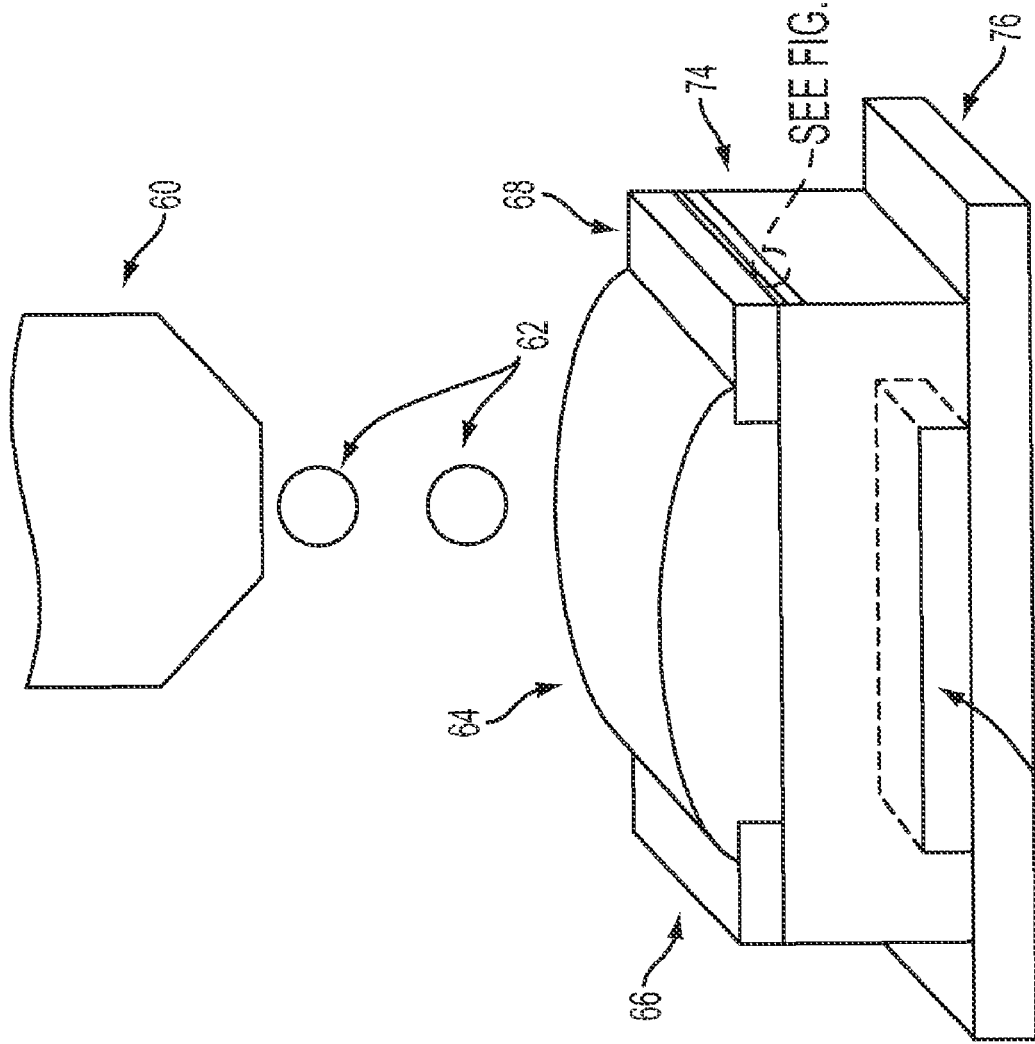

PRINTED TFT ARRAY

STATEMENT REGARDING FEDERALLY SPONSORED RESEARCH OR DEVELOPMENT

This invention was made with United States Government support under Cooperative Agreement No. 70NANB7H3007 awarded by the National Institute of Standards and Technology (NIST). The United States Government has certain rights in the invention.

BACKGROUND

The present application is directed to additive manufacturing processes for the production of electronic devices and/or components, and more particularly to manufacturing low cost display backplanes implementing TFT arrays configured using additive printing techniques.

Additive printing, additive processing and other similar terminology refer to processes were material is configured into electronic devices and/or components without the need of subsequent steps to remove portions of the material. This is in contrast to typical subtraction fabrication techniques which deposit, lay down or otherwise provide material, followed by removal of selected portions of the material.

Therefore, additive processing, including additive printing, has the potential for reducing the amount of material wasted in a manufacturing operation, as well as minimizing the number processing steps needed complete a manufacturing process, compared to traditional subtractive processing.

In additive printing each material can be deposited where it needs to be in a single process step, and the only wasted material is solvent. Additive printing requires solution-based materials and printing processes and devices capable of printing with the necessary precision. Two examples of devices which have been constructed by the use of additive printing in the display technology area are PLED displays and LCD color filters. A review of using additive printing for the formation of TFTs as well as other active components is set forth in R. A. Street et al., "Jet Printing Flexible Displays", *Materials Today*, Vol. 9, Issue 4, April 2006, pp. 32-37. A discussion regarding methods used to deposit and integrate solution-processed material to fabricate TFT backplanes by inkjet printing are also discussed in the article by Ana C. Arias et al., "All-Additive Ink-Jet-Printed Display Backplanes: Materials, Development and Integration", *Journal of SID*, Jul. 15, 2007, pp. 485-489. Still further, a specific method of producing electrical circuit elements to control electronic displays using additive methods is described in U.S. Pat. No. 6,521,489, titled, Preferred Methods for Producing Electrical Circuit Elements Used to Control an Electronic Display, to Duthaler et al., issued Feb. 18, 2003.

Thus, research directed to low-cost display backplane fabrication which employs additive printing for some or all of the layers that make up a TFT circuit is ongoing. A particular candidate material for use in additive printing processes is nano-particle silver, which can be readily printed and sinters at low temperature to form a highly conductive film. One discussion regarding such nano-particles is found in U.S. Pat. No. 7,270,694, titled, Stabilized Silver Nano-Particles and their use, to Li et al., issued Sep. 18, 2007. The '692 patent includes a process where a plurality of silver-containing nano-particles with molecules of a stabilizer are on the surface of the silver-containing nano-particles. The resultant solution is noted to be of particular benefit in the use of various applications, including production of thin film transistors (TFTs), light emitting diodes (LEDs), RFID tags, photovoltaic cells, among others.

As mentioned, a desirable aspect of additive printing is that it minimizes the processing steps needed to manufacture electronic components. Additive printing also reduces the material which is wasted resulting in lower material cost. Therefore, the conventional thought is to focus on improving additive printing processes to lower the number of manufacturing steps. However, it is also appreciated that for certain steps the materials needed to achieve the printing operations are themselves quite costly. For example, the mentioned nano-particle silver as well as other high-cost metal and/or non-metal solutions are extremely expensive, which adds undesirable costs to the manufactured electronic device and/or component. Therefore, to improve the overall effectiveness of the additive processes it is desirable to address the issue of high-cost metal and/or non-metal solutions.

INCORPORATION BY REFERENCE

U.S. Pat. No. 6,011,531, titled "Methods and Applications of Combining Pixels to the Gate and Data Lines for 2D Imaging and Display Arrays," by Mei et al., issued Jan. 4, 2000, is hereby incorporated by reference in its entirety.

U.S. Pat. No. 7,270,692, titled, "Stabilized Silver Nano-Particles and Their Use," to Li et al., issued Sep. 18, 2007, is hereby incorporated by reference in its entirety.

U.S. Pat. No. 6,521,489, titled "Preferred Methods for Producing Electrical Circuit Elements Used to Control an Electronic Display," to Duthaler et al., issued Feb. 18, 2003, is hereby incorporated by reference in its entirety.

An article by R. A. Street et al., titled "Jet Printing Flexible Displays", *Materials Today, Vol.* 9, Issue 4, April 2006, pp. 32-37; and an article by Ana C. Arias et al., "All-Additive Ink-Jet-Printed Display Backplanes: Materials, Development and Integration", *Journal of SID*, Jul. 15, 2007, pp. 485-489, are each incorporated by reference in their entireties.

BRIEF DESCRIPTION

An electronic device and/or component is manufactured using additive processing steps, including additive printing steps. A first layer is printed using additive printing techniques wherein a single first material is used to print the first layer in a single processing step. A second layer is printed in more than a single printing step where a first portion of the second layer is printed using a second material and a second portion of the second layer is printed using a third material, and the second and third materials are different from each other.

BRIEF DESCRIPTION OF THE DRAWINGS

FIG. 6 shows a side view of a configured semiconductor device in accordance with the present concepts; and FIG. 6A is an expanded view of a portion of FIG. 6.

DETAILED DESCRIPTION

Figure 1:
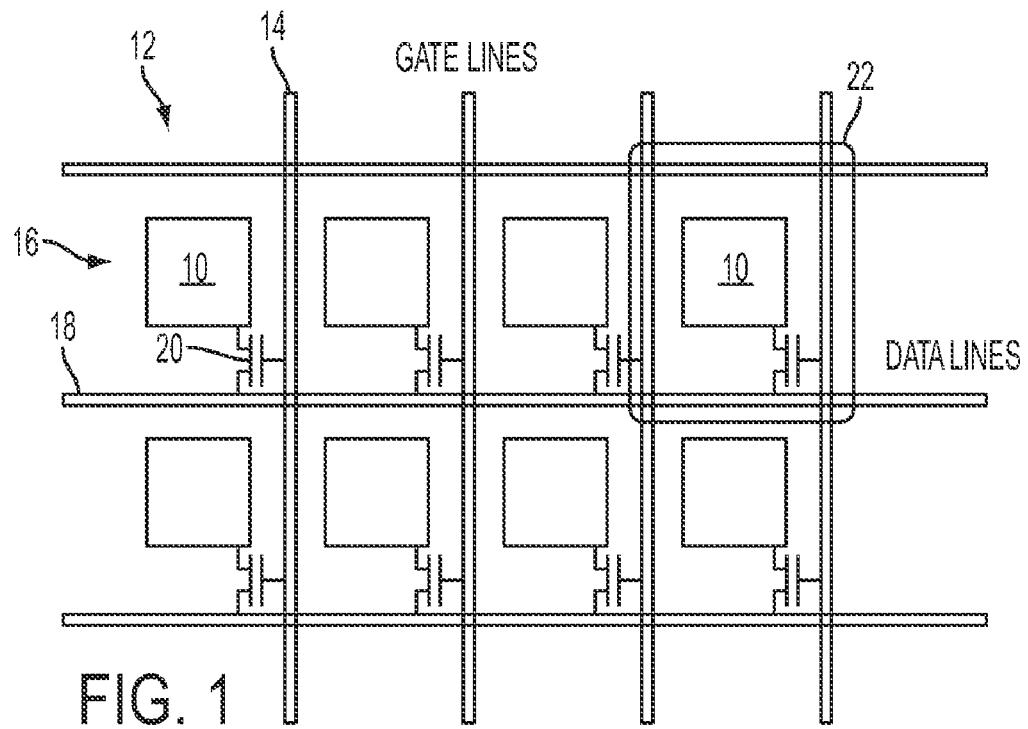
FIG. 1 shows a first embodiment of a partial active TFT array which may be used as part of a backplane display.

Thin film transistor controlled pixel arrays are the basic building blocks in many types of large area displays and image sensors. In conventional array designs, a scan driver controls the gate of TFTs to transfer signals to and/or from each pixel through data lines. As illustrated in FIG. 1, pixel contact pads 10 are arranged in columns and rows to form an array. Each column of pixel contact pads 12 share one gate line 14 and each row of pixel contact pads 16 share one data line 18. The pixel contact pads provide the voltage to operate the display element or form part of the pixel sensor in a sensor array. TFTs 20 are located at the juncture of each gate line 14 and data line 18 such that one of the TFTs 20 is connected to a respective pixel sensor/display element 10, gate line 14 and data line 18. Thus, in conventional designs, a pixel configuration 22 is comprised of a gate line, a data line, a pixel sensor/display element and some margins. The width of the gate and data lines are determined by the requirement of conductance to transfer electrical signals. The resolution of an array is limited by both the size of a sensor/display element and the width of the gate and data lines. In order to maintain a reasonable filling factor for imaging or display, the size of the pixel sensor/display element 10 cannot be too small, or the quality of the display or image is affected.

In current flat panel displays of image sensors, each column of pixels connects to external shift registers of high speed single crystalline silicon circuits via a gate line, and each row of pixels connects to external data transferring systems via a data line.

Figure 2:
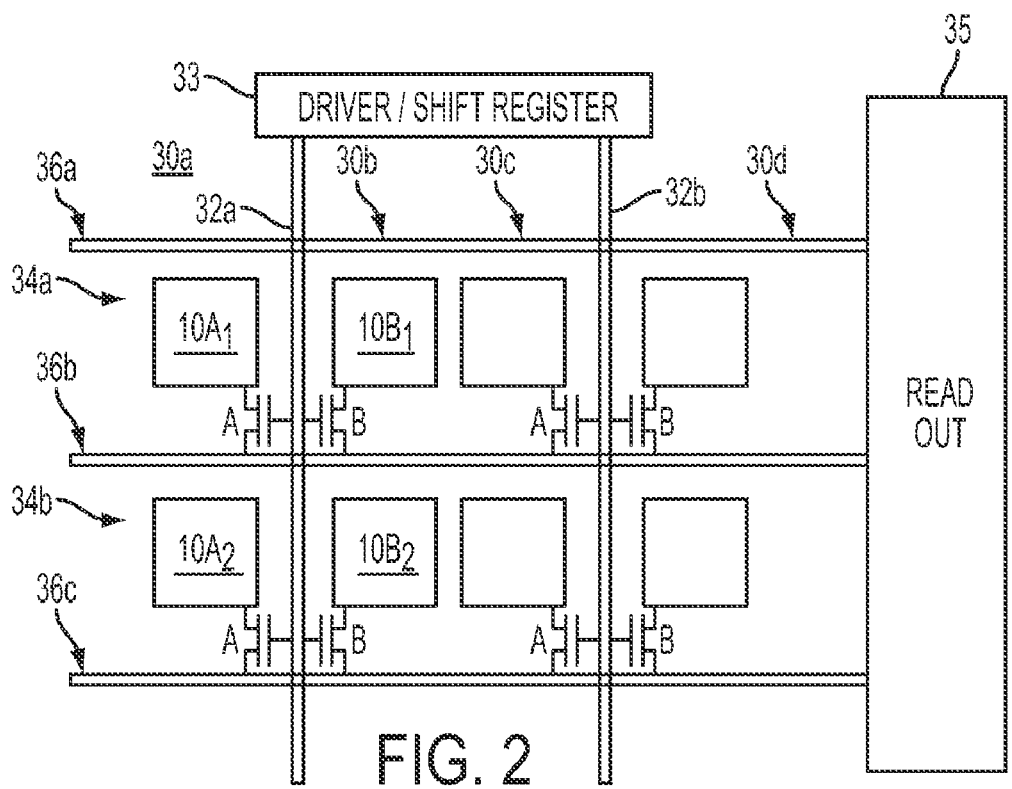
FIG. 2 illustrates a second embodiment of an active TFT array arranged in a different connection mode.

FIG. 2 provides another simple example of an imaging and display array configuration where two of pixel columns 30a and 30b share a single gate line 32a (with pixel columns 30c and 30d sharing gate line 32b) and each pixel row 34a (34b) is connected to a single data line 36b (36c), such that pixel sensor/display elements (sometimes referred to as pixels) 10A, and 10B, are within a same pixel cluster. An array is constructed by repeating this cluster in columns and rows.

Using a type-A and type-B TFT as switches, two columns or two rows of pixels can be connected to one gate line or one data line. The type-A and type-B TFTs can be TFTs with different turn-on characteristics, such as N-channel and P-channel TFTs. The N-channel TFT has a turn-on or voltage threshold at a positive voltage value ($V_{T(n)}$). By using the N-channel and P-channel TFTs in a single array, a set of positive and negative pulses are applied to a shift register (not shown) by known techniques, to address the gate lines thereby selecting each column pixel successively.

Addressing for the array of FIG. 2 may be realized by connecting every gate line to every two stages of a shift register 33, with results being sent to read-out 35. For example, a positive gate pulse may be used to turn on pixels (with type-A TFTs) in columns 30a and 30c, while negative pulse may be used to turn on pixels (with type-B TFTs) in columns 30b and 30d.

Arrays such as described may be used in a variety of products including display backplanes used in a variety of imaging display devices, among other active electronic components.

Jet printing, piezoelectric printing, and acoustic printing, as well as offset printing, gravure printing and flexography printing among others are promising technologies for patterning and forming electronic devices, as they require no physical mask. The jet-printing techniques also have digital control of ejection. Printing techniques also have the potential to reduce manufacturing costs and enable roll-to-roll processing. With particular attention to display systems, there is considerable interest in manufacturing low-cost display backplanes using printing techniques. One approach is to use additive printing for most or all of the layers that make up the transistor circuit and/or array. Printing processes, such as those above are cheaper than technologies such as photolithography, etching or other subtractive techniques, and additive processes use the minimum amount of material, compared to the subtractive processes, in which a thin film is deposited and material is then removed. Low-cost printed arrays are of particular interest for low complexity displays, reflective displays and electric paper displays, among others.

Turning to FIGS. 3A-3D depicted is an additive printing process for a portion of an additive printed TFT array.

Figure 3A:
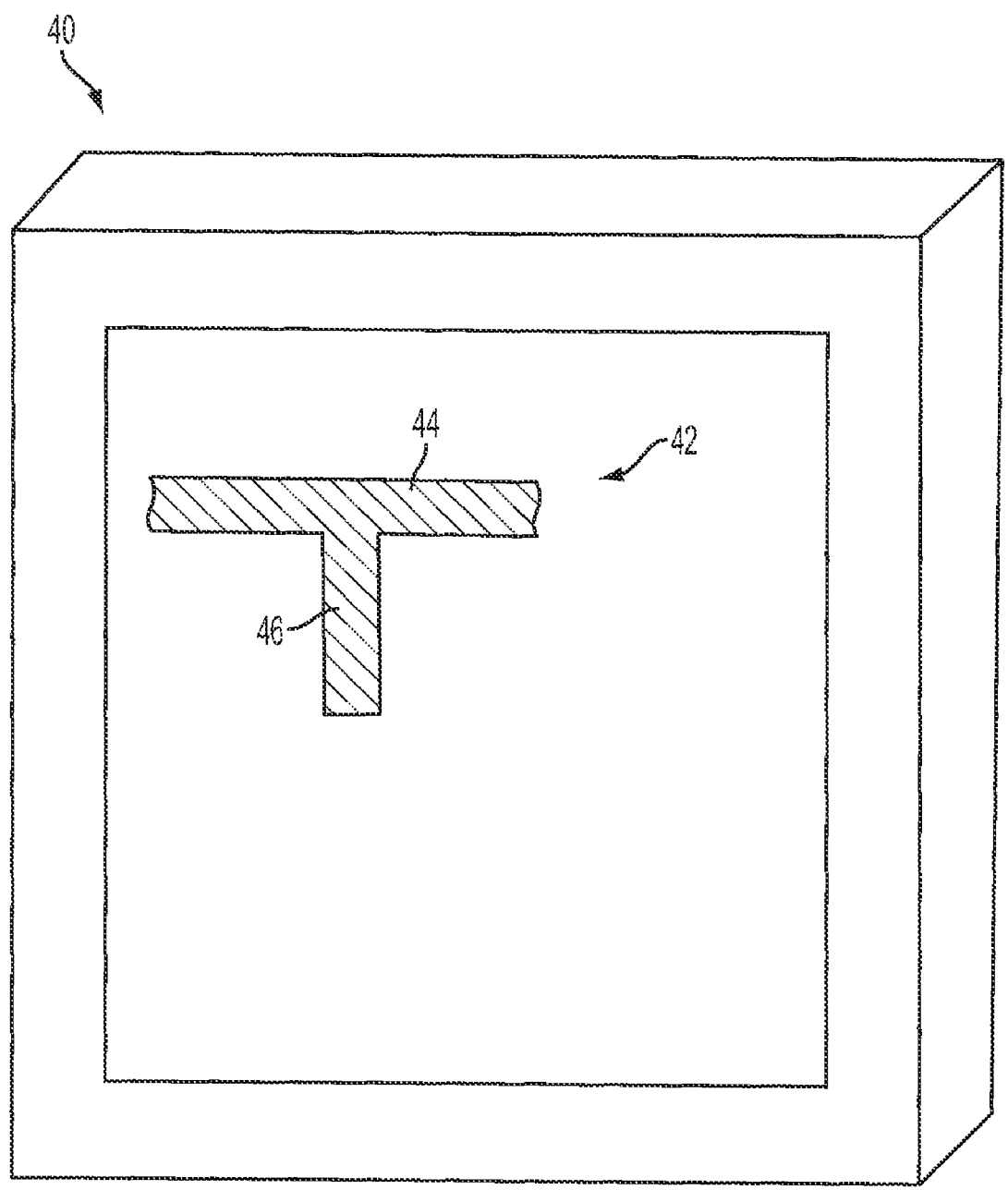
FIGS. 3A-3D show processing steps for manufacturing an active TFT array employing additive processing.

As shown in FIG. 3A provided is a substrate on which is printed a gate metal layer 42, which forms a gate address line 44 and a gate contact 46. Printing of gate metal layer 42 can in one embodiment be accomplished by additive printing techniques.

Figure 3B:
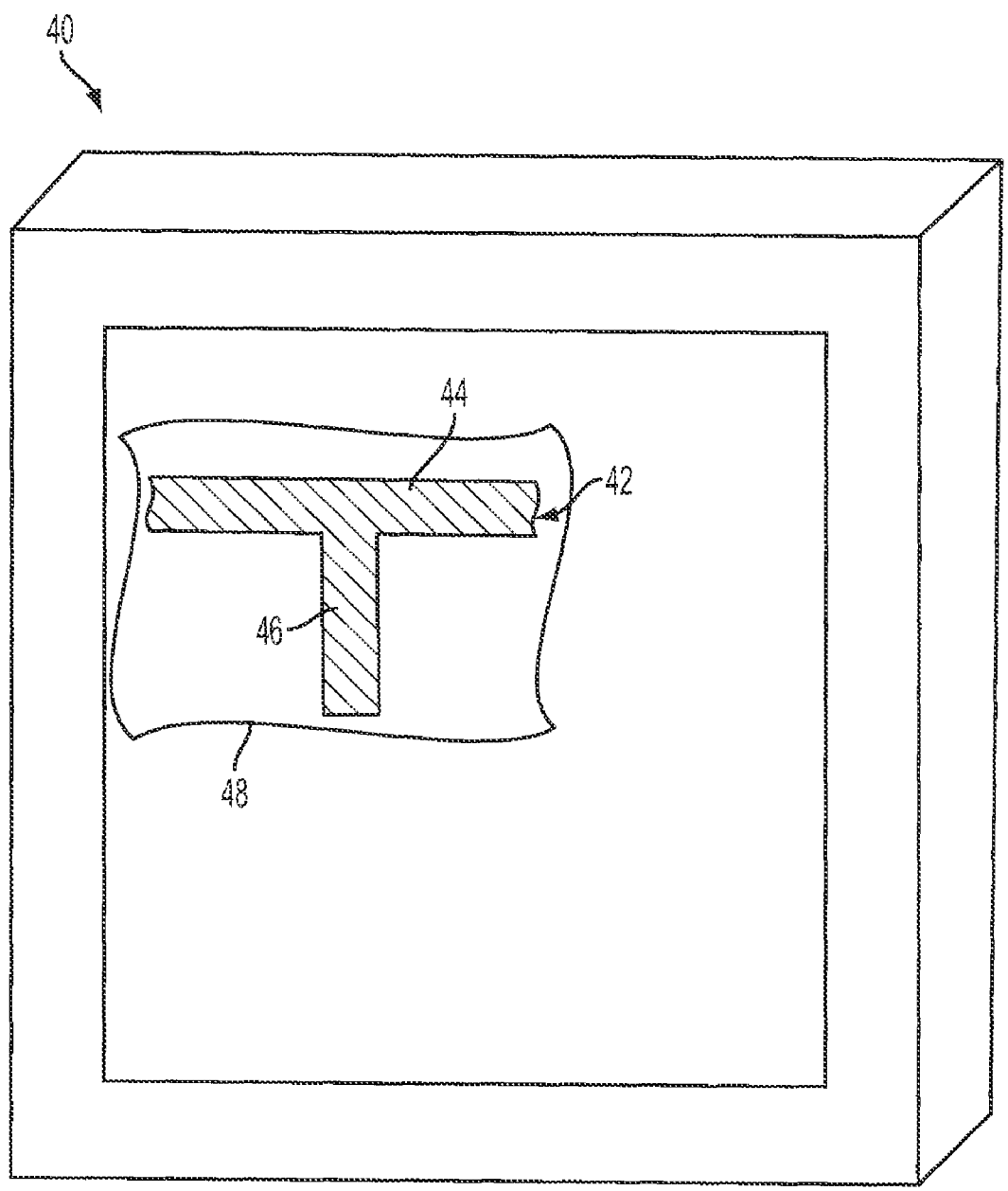

In a next step, as shown in FIG. 3B, a dielectric material 48 is deposited over gate metal layer 42, depositing the gate dielectric 48 requires little patterning, and can be accomplished by spin coating or slot-printing, among other techniques.

Figure 3C:
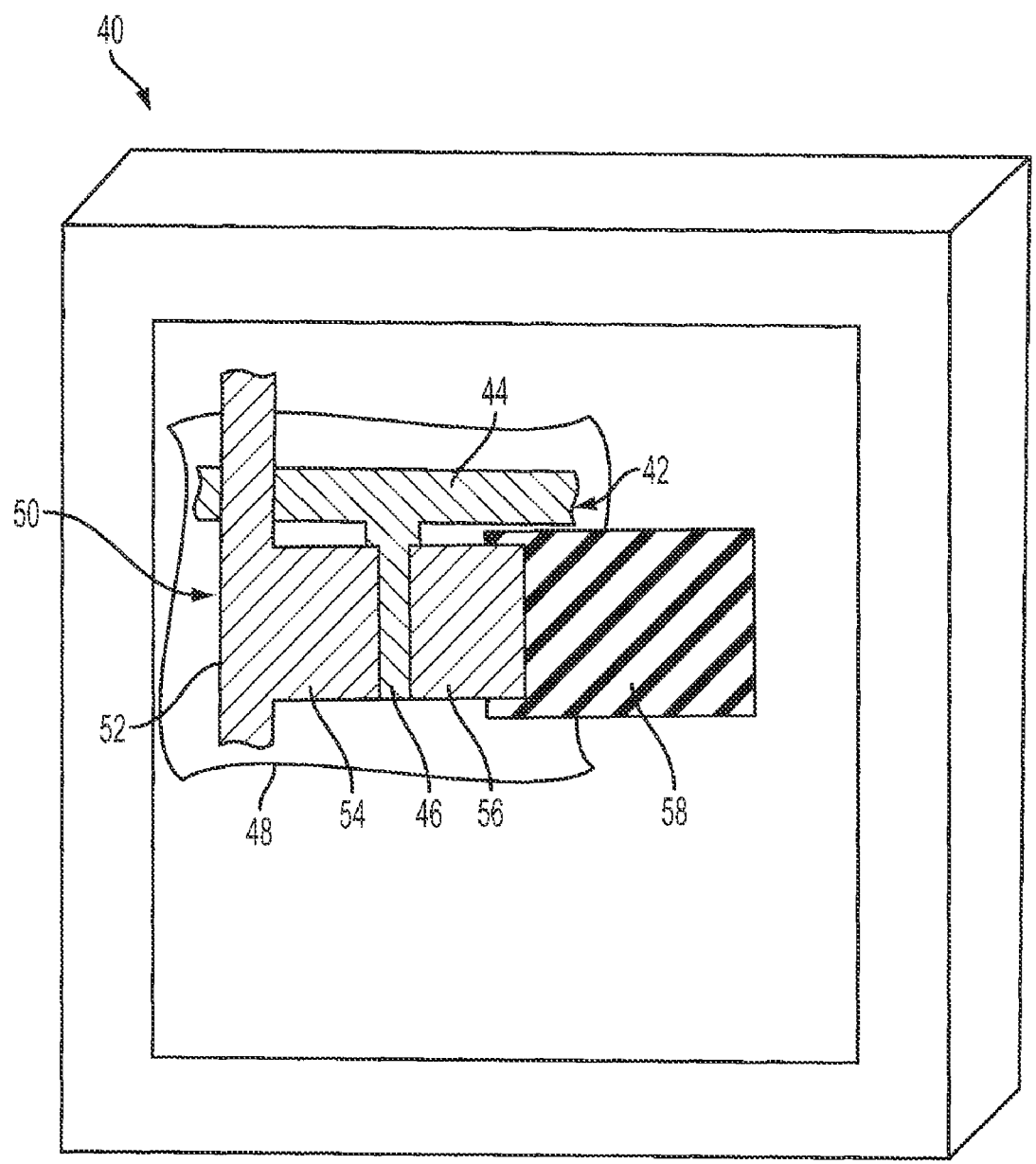

In a next step, as shown in FIG. 3C, a source-drain layer 50 is printed and forms a data address line 52, a TFT drain contact 54 and a source contact 56. Also printed in source-drain layer 50 is a pixel contact pad 58. Printing of source-drain layer 50 can be accomplished by additive printing techniques.

Figure 3D:
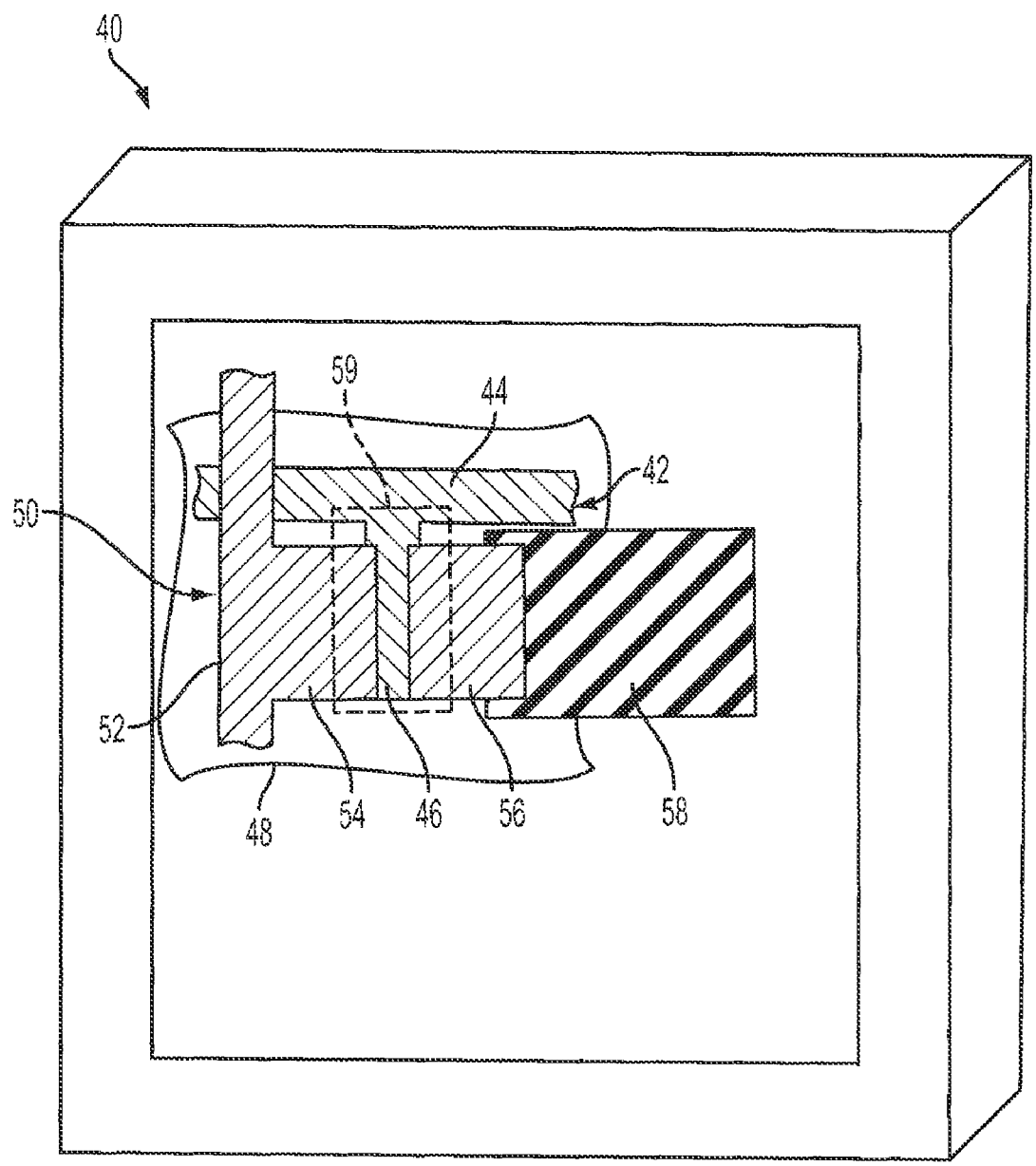

Finally, as shown in FIG. 3D, a semiconductor material 59 is printed between drain contact 54 and source contact 56. Again, this process can be accomplished by additive printing techniques.

As previously mentioned, a desirable aspect of additive printing is the elimination of processing steps, as this minimizes the time and resources necessary to form the active electronic component.

However, the present application is directed to concepts which are counterintuitive to the conventional thinking of additive printing research. For example described are additive printing techniques which add at least one processing step in order to obtain certain economies to make the use of additive printing more viable.

Particularly, the typical size and speed requirements of a display require a high conductivity metal for the gate and data address lines. These address lines are typically long and thin, and a low resistance is needed for any display that has a reasonably short refresh time. A material which provides the desired low resistance is silver, and in particular nano-particle silver, which can be readily printed and sinters at low temperature to form a highly conductive film. One particular advantage of nano-particle silver and other nano-material solutions is that the particles are of very small dimensions, and therefore have reduced melting temperature due to the thermodynamic effects related to the surface energy. For example, nano-particle inks sinter at temperatures below 200° C. and are suitable for low-temperature processes required of flexible plastic substrates.

However, a problem with using silver is that silver, and in particular nano-particle silver solution as well as other low-resistance metals, are their expense. Therefore, for electronic devices and/or components which require a significant amount of expensive metals or other materials, means these metals and/or materials become a very significant portion of the total manufacturing cost of the electronic component. One such electronic component being a TFT display backplane.

With continuing attention to FIGS. 3A-3D, it can be seen source-drain layer 50 consists of data address line 52, TFT drain contact 54, TFT source contact 56 and pixel contact pad 58. Contact pad 58 should be as large as possible, since it controls the operation of the media, and un-contacted media adversely affects the visual appearance of the display. In consideration of this source-drain layer 50 is covered by as much conductive material as possible, and pixel contact pad 58 may constitute as much as 70 to 80 percent of the pixel, while the address lines have about 20 percent or less of that area.

However, a particular aspect of TFT arrays is that pixel contact pad 58 does not need to be as conductive as data address line 52. While for an electronic display data address line 52 should have a resistance of about 1 ohms/sq. or less, pixel contact pad 58 may have a resistance of 1000 ohm/sq. or larger, of course these values will or may change depending on the specific design and speed requirements of the implementation. The reason for this difference, in the case of an electronic display, is that data address line 52 carries current from the periphery of the backplane, while pixel contact pad 58 only passes current over a small area.

To obtain a lower manufacturing cost, the process set forth in FIGS. 3A-3D, as well as other known additive manufacturing processes, print each layer in a single processing step, using a single material. For example, in processing gate layer 42, which includes gate data line 44 and gate member 46, a print head may in single pass generate the layer such as shown in FIG. 3A. Similarly, the various portions of source-drain layer 50, as depicted in FIG. 3C will also be processed by print heads using a single material in a single processing step.

However, the high cost of certain materials, such as metal, which are used in the manufacture of printed electronic devices and/or components, such as a low-cost backplane display having an array of TFTs, produced a counterintuitive thought of increasing the number of processing steps to obtain an improved backplane display, or other active component, of lower cost. More particularly, in the embodiment set out in FIGS. 4A and 4B, it has been determined to be more effective to print source-drain layer 50' in two processing steps. For clarity of discussion various layers such as the dielectric layer 48 and the semi-conductor layer 59 of the previous figures are not shown.

Figure 4A:
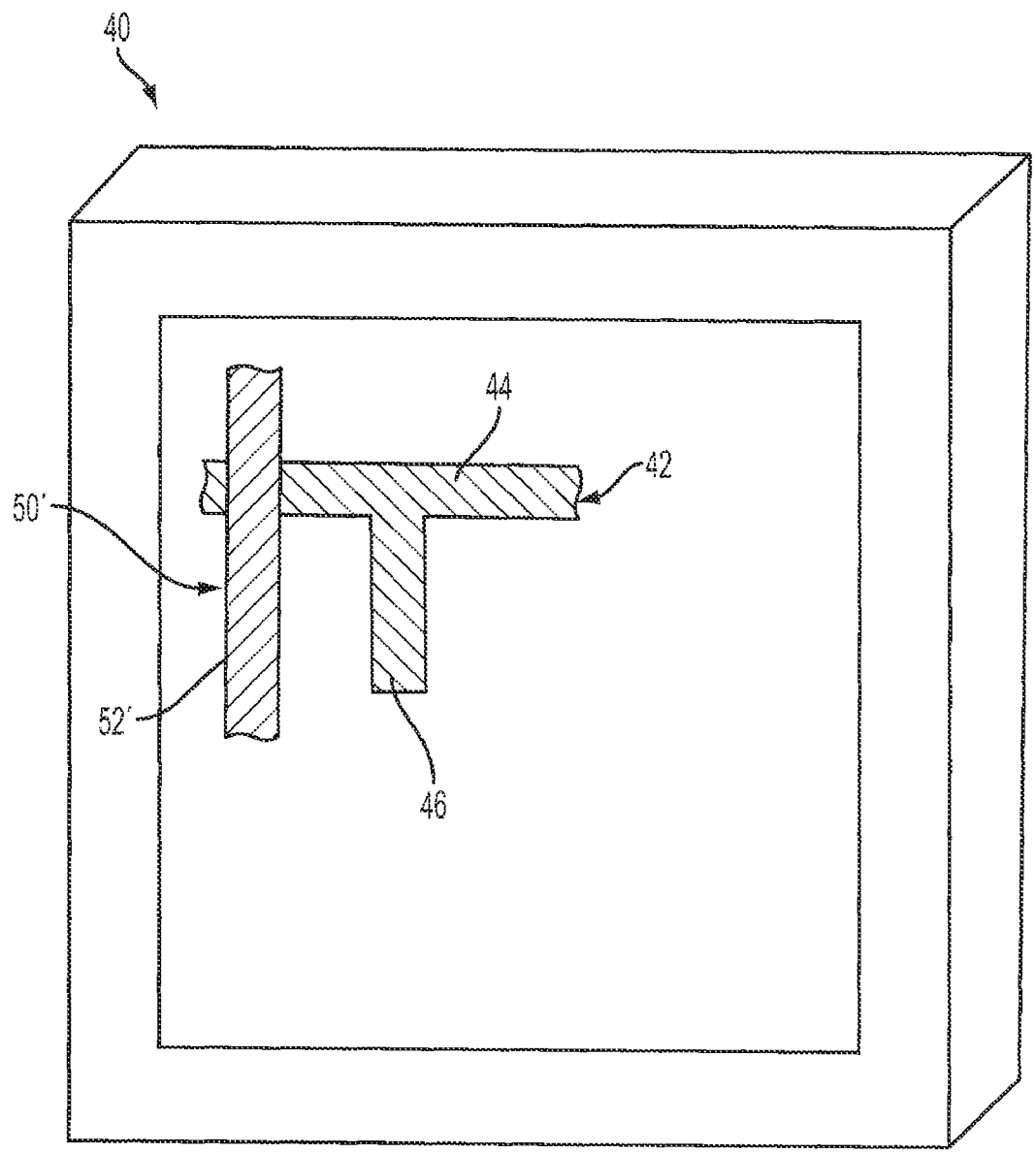
FIGS. 4A-4B show an embodiment of the processing according to the concepts of the present application.
Figure 4B:
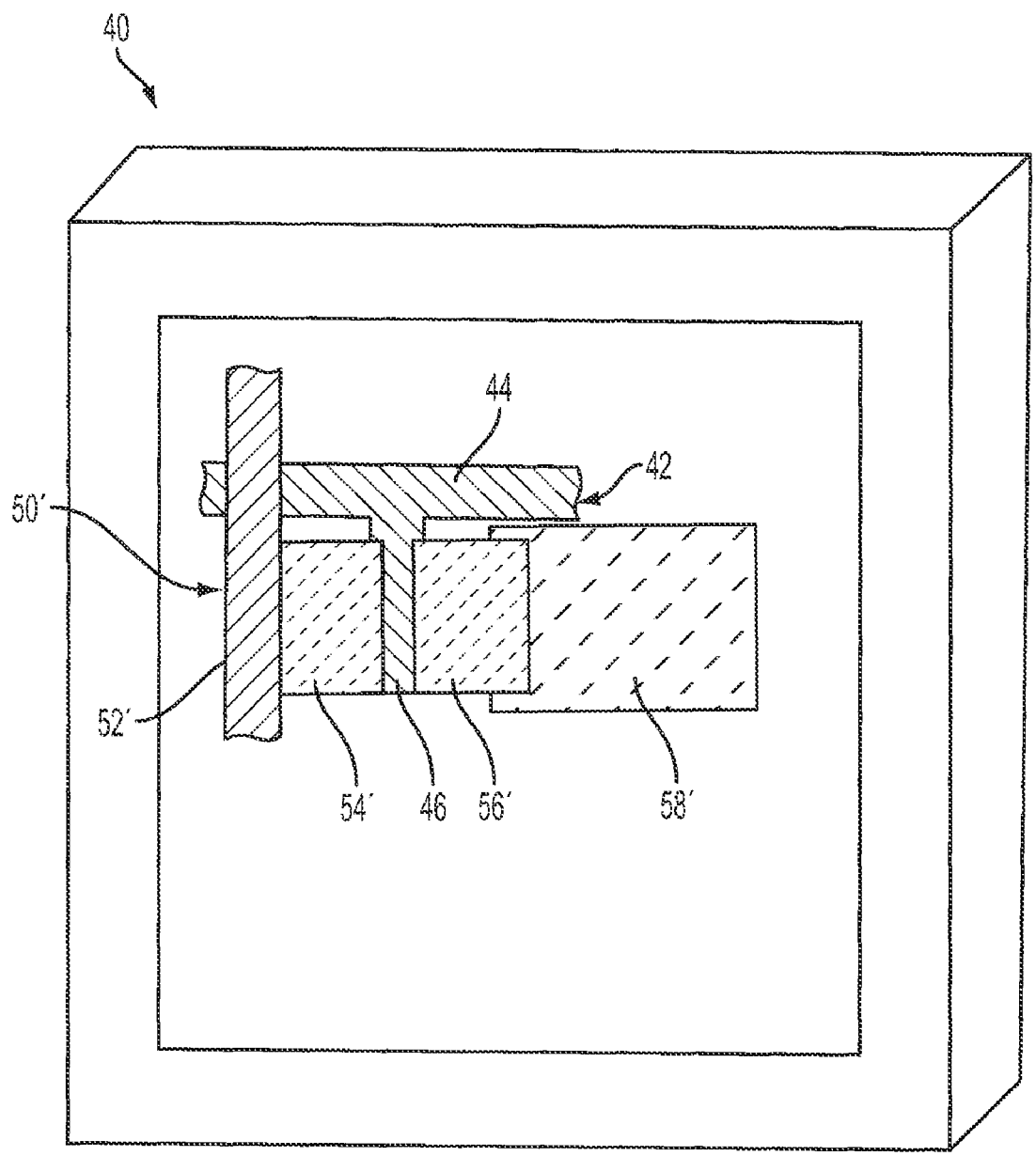

In FIG. 4A, an initial step prints a first portion, which includes address line 52' with a first highly conductive material such as silver, potentially in the form of a nano-particle silver solution, or other highly conductive material. The next printing step shown in FIG. 4B prints a second portion which includes TFT drain contact 54', TFT source contact 56' and pixel contact pad 58'. This second printing step uses a second conductive material having a higher resistance than the first conductive material, and could therefore be a much less expensive material. The added cost of the second printing step is more than offset by the lower cost of the higher resistance material. Both portions of source drain layer 50' are printed in the same plane. Contact between data address line 52' and TFT drain contact 54' may be accomplished by printing one of the materials so the two different materials overlap.

Figure 5:
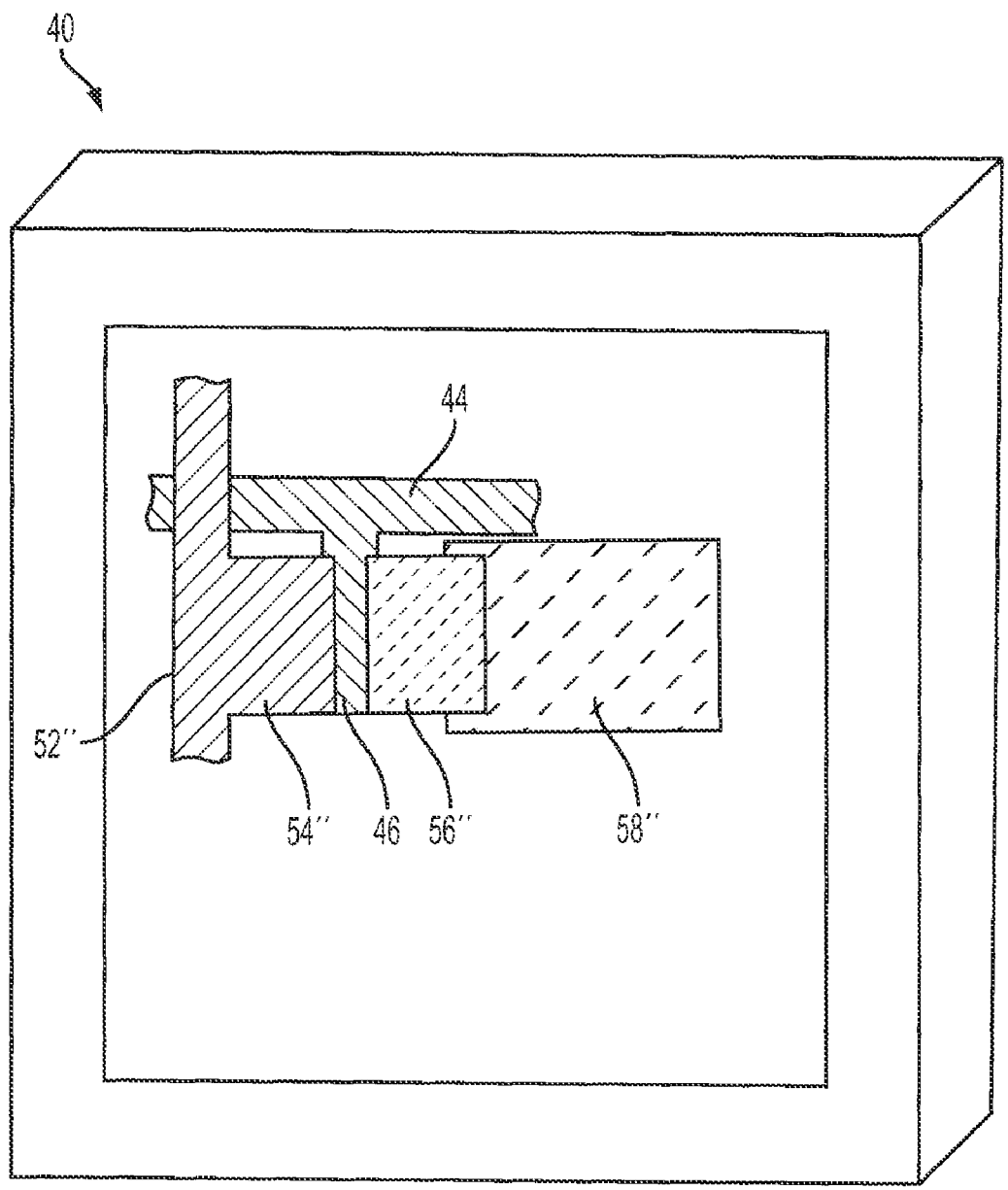
FIG. 5 shows another embodiment for processing according to the present application.

In an alternative embodiment, as shown in FIG. 5, source-drain layer 52" is again formed by two separate printing processes, however in this embodiment a first portion which now includes address line 52" and TFT drain contact 54", are both formed with a low resistance material (e.g., silver), and a second portion in this embodiment includes a TFT source contact 56" and pixel contact pad 58", which are formed of the higher resistance material. Again, for clarity of discussion various layers such as the dielectric layer 48 and the semi-conductor layer 59 of the previous figures have not been included in FIG. 5.

These foregoing embodiments point out that the exact parts of the layers that are formed of the different materials can be altered depending upon the particular implementation. Thus, tradeoffs between device and/or component performance and cost of manufacture can be taken into consideration, and due to the flexibility of the additive printing process the manufacturing steps can be easily altered. Such of course would not be easily achieved in the subtractive manufacturing domain.

The materials which may be selected for use as the lower resistance material may be those mentioned, including silver and the nano-particle silver solution. However, it is to be appreciated other materials are contemplated for use in connection with the present concepts. Examples of printable higher resistance materials are intrinsically conducting polymers such as poly(3,4-ethylenedioxythiophene) (PEDOT), or other appropriate conducting polymer. Still further, while the above concepts have focused on materials related to their resistive characteristics the materials may be selected for other attributes, such as capacitance values, thermal stress capabilities, and flexibility, among others.

Turning to FIGS. 6 and 6A, depicted is a side-view of a TFT being manufactured in accordance with the simplified additive printing processing previously described. More particularly, FIG. 6 illustrates the ongoing printing, by printing device 60, of a semi-conductor material 62 to form a bottom gate TFT 64 with drain contact 66, source contact 68 and gate 70 already in place (i.e., undertaken in this situation by previous additive printing processes). Slightly different from previous embodiments this bottom gate TFT includes, as detailed in FIG. 6A, a SiO2 layer 72 located over dielectric layer 74. The gate 70 and portions of dielectric layer 74 are located on a substrate 76. As previously described drain contact 66 and source contact 68 are printed with materials different from each other. Thus while both are in the same source-drain layer they have been printed by two separate printing operations. Address lines, data lines and the pixel contact are not shown in this figure, they would however be formed as discussed in the previous embodiments.

Devices as presented in the foregoing figures may also be printed with polyfluorene, polythiophene (PQT12), and pentacene from a soluble precursor. Since the TFT current flows very close to the semiconductor-dielectric interface, non-uniformity in thickness and roughness in the top surface of the semi-conductor as a result of the printing process are not important. Furthermore, it does not matter if the semiconductor extends over the source and drain contacts, so long as the channel region is coated completely. In a TFT array, the semiconductor should be patterned to avoid leakage paths between neighboring TFTs. Print head 60 may be a jet print head, piezoelectric print head, or an acoustic print head, among others which fulfill additive printing requirements.

The preceding description has focused on the source-drain layer of a display backplane as teaching the concept of different materials being used in the same layer of an active component manufacturing process. However, these concepts may be applied to other layers in the backplane or other active devices, such as, for example, an x-ray imager, an RFID tag, TFT filter, LCD color filters, PLED displays, among others. The techniques will apply when a single layer can be printed at lower cost by separating the layer into two or more portions, when only one of the portions require more expensive material, and where the printing of the layer may be separated into two or more steps.

It will be appreciated various ones of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of constructing a thin film transistor array employing additive processing techniques, comprising:
   printing a gate layer in a single first printing operation which prints a gate address line and a gate contact with a first material;
   depositing a gate dielectric of the gate layer;
   printing a source-drain layer in two separate printing operations, including a second printing operation which prints a data address line, a source contact and a drain contact using a second material, and a third printing operation which prints a pixel contact pad using a third material which is different from the first material; and
   printing a semiconductor material between the source contact and the drain contact.

2. The method according to claim 1 wherein the second printing operation and the third printing operation result in an overlap between the second material and the third material.

3. The method according to claim 1 wherein the step of printing the gate layer is accomplished by at least one of jet-printing, piezoelectric printing or acoustic printing.

4. The method according to claim 1 wherein the step of depositing the dielectric layer includes spin-coating or slot printing.

5. The method according to claim 1 wherein the step of printing the source-drain layer is accomplished by at least one of jet-printing, piezoelectric printing or acoustic printing.

6. The method according to claim 1 wherein one of the second material and the third material of the source-drain layer is one of silver or and intrinsically conducting material.

7. The method according to claim 1 wherein the silver is part of a nano-particle silver solution.

8. The method according to claim 1 wherein the data address line has a resistance of 1 ohm/sq. or less.

9. The method according to claim 1 wherein the pixel contact pad has a resistance of 1000 ohm/sq. or less.

10. An electronic device created by additive processing techniques, the electronic device comprising:
    a first printed layer of the electronic device formed in a single printing operation with a first conductive material, the first printed layer being a gate layer including a gate address line and a gate contact formed with the first conductive material;
    a gate dielectric layer formed over the gate layer by a dielectric material;
    a second printed layer of the electronic device formed in at least two printing operations, including (i) a first printed portion of the second layer formed with a second conductive material and (ii) a second printed portion of the second layer formed with a third conductive material, different from the second conductive material, the second printed layer being a printed source-drain layer including a data address line, a source contact, and a drain contact formed with a second conductive material, and a pixel contact pad formed with a third conductive material which is different from the second conductive material; and
    a semiconductor material between the source contact and the drain contact.

11. The electronic device according to claim 10 wherein the first printed portion of the second printed layer and the second printed portion of the second printed layer overlap.

12. The electronic component according to claim 10 wherein one of the second conductive material or the third conductive material of the second printed layer is one of silver or an intrinsically conductive material.

13. The electronic component according to claim 12 wherein the silver is part of a nano-particle silver solution.

* * * * *